(12) United States Patent
Jhon et al.

(10) Patent No.: US 9,188,484 B2
(45) Date of Patent: Nov. 17, 2015

(54) APPARATUS AND METHOD FOR CALIBRATING EXTREME ULTRAVIOLET SPECTROMETER

(71) Applicant: KOREA INSTITUTE OF SCIENCE AND TECHNOLOGY, Seoul (KR)

(72) Inventors: Young Min Jhon, Seoul (KR); Yong Soo Kim, Seoul (KR); Min Ah Seo, Seoul (KR); Jae Hun Kim, Seoul (KR); Min Chul Park, Seoul (KR); Sun Ho Kim, Seoul (KR); Deok Ha Woo, Seoul (KR); Seok Lee, Seoul (KR); Taik Jin Lee, Seoul (KR); Myung Suk Chun, Seoul (KR); Woon Jo Cho, Gyeonggi-do (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 14/225,698

(22) Filed: Mar. 26, 2014

(65) Prior Publication Data

US 2015/0192463 A1    Jul. 9, 2015

(30) Foreign Application Priority Data

Jan. 9, 2014   (KR) .......................... 10-2014-0002963

(51) Int. Cl.
*G01J 3/02* (2006.01)

(52) U.S. Cl.
CPC ..................................... *G01J 3/0297* (2013.01)

(58) Field of Classification Search
CPC ......... G01J 1/4228; G01J 1/4257; G01J 3/02; G01J 3/0291; G01J 3/0297
See application file for complete search history.

(56) References Cited

U.S. PATENT DOCUMENTS 7,362,416 B2 *    4/2008    Ito et al. .......................... 355/67

FOREIGN PATENT DOCUMENTS

| KR | 101078135 B1 | 10/2011 |
| KR | 101349898 B1 | 1/2014 |

\* cited by examiner

*Primary Examiner* — David Porta
*Assistant Examiner* — Faye Boosalis
(74) *Attorney, Agent, or Firm* — Ladas & Parry LLP

(57) ABSTRACT

Provided are an apparatus and method for calibrating an extreme ultraviolet (EUV) spectrometer in which a wavelength of a spectrum of EUV light used for EUV lithography and mask inspection technology can be measured accurately.

9 Claims, 4 Drawing Sheets

APPARATUS AND METHOD FOR CALIBRATING EXTREME ULTRAVIOLET SPECTROMETER

CROSS-REFERENCE TO RELATED APPLICATION

This application claims priority to and the benefit of Korean Patent Application No. 2014-0002963, filed on Jan. 9, 2014, the disclosure of which is incorporated herein by reference in its entirety.

BACKGROUND

1. Field of the Invention

The present invention relates to an apparatus and method for calibrating an extreme ultraviolet (EUV) spectrometer, and more particularly, to an apparatus and method for calibrating an EUV spectrometer to accurately measure a wavelength of a spectrum of EUV light used for EUV lithography and mask inspection technology.

2. Discussion of Related Art

In general, an EUV beam, for example, electromagnetic radiation (also known as soft X-rays) having a wavelength of about 124 nm or less, which includes light having a wavelength of 13.5 nm, can be used in a photolithography process to form a very small pitch on a substrate, for example, a silicon wafer.

That is, EUV light and X-rays are located in a shorter wavelength region than visible light, and thus can enhance measurement resolution according to a diffraction limit which limits sizes of wavelengths in precision measurement using light, and can be used for fine measurement or nondestructive testing involved in biotechnology using a good transmission characteristic by extending to the X-ray region.

Particularly, if a good coherent light can be generated at the same time, various applications using interference and diffraction phenomena of light are possible. Because a repetition rate of an incident femtosecond laser can be maintained, it can be used for precision spectroscopy or frequency standard measurement, and so on in EUV and X-ray regions.

One of various methods of generating EUV light and X-rays is a method using a synchrotron. When EUV light and X-rays are generated using a synchrotron, there are advantages in that a large amount of light of good quality can be obtained and various wavelength bands can be obtained at the same time, however, because a facility itself is very enormous and expensive, there is a problem in that it cannot be simply configured in a laboratory stage.

As a method of overcoming this problem, recently, a high-order harmonic generation (HHG) method using a high power femtosecond pulse laser has been proposed, and thus coherent EUV light and soft X-rays can be generated with a relatively small experimental device.

In the HHG method, electrons are ionized, move along a track and are recombined by applying a high time-varying electric field to an inert gas such as, for example, argon (Ar), neon (Ne), xenon (Xe), and so on, and the energy corresponding to the sum of the ionization energy and kinetic energy of the electrons generates light of the EUV and X-ray band.

HHG has typically been designed or made by injecting an inert gas into a gas cell, with the used inert gas leaving the gas cell naturally.

Alternatively, lithium (Li), tin (Sn) and a semiconductor device are also able to generate EUV light in addition to inert gases such as Ar, Ne, Xe, and so on, and inert gases are used to generate EUV light in current HHG technology using a gas cell only because HHG using a gas cell uses a gas as a medium. Thus, there is no specific limitation to inert gases, and EUV light can be generated using other methods.

Meanwhile, because ultra-refinement of a semiconductor process for high integration is required, light sources used for lithography including G-line (436 nm), I-line (365 nm), krypton fluoride (KrF) (248 nm) and argon fluoride (ArF) (193 nm) have been developed.

However, new lithography technology extending resolution in semiconductor processes of 90 nm or less was still required, for which ArF immersion lithography and double-patterning lithography were developed, and thus dynamic random access memories (DRAMs) and NAND flash memories have recently been successfully mass-produced in 23 nm and 20 nm processes, respectively.

Among various techniques being studied to surpass the ArF lithography as next generation lithography, EUV lithography has reached a stage of trial production in major semiconductor companies, and research and development thereof are being actively conducted worldwide.

Meanwhile, in order to inspect defects of mask made by EUV lithography, EUV light is also needed. Particularly, a technique of inspecting defects of a mask with the same wavelength as used in lithography is called an actinic mask inspection technique. In order to generate EUV light with the same EUV wavelength as used in lithography, the HHG method is needed. In order to check whether EUV light generated by the HHG method matches a desired wavelength, a spectrum should be measured using an EUV spectrometer. In this case, calibration of the spectrometer is necessary in order to accurately measure the spectrum. As a calibration method of EUV light, there is a method using an atomic line which has been used for some time. Each inert gas has unique fluorescence lines known as atomic lines. Because wavelength values of atomic line spectra have been studied and widely known since decades ago, EUV light can be calibrated based on a position and a wavelength value of an atomic line spectrum.

However, in order to acquire a degree of strength that a charge-coupled device (CCD) camera of the spectrometer is able to measure, energy several times greater than energy of a laser used for HHG is needed. Therefore, there is a problem in that a laser light source that outputs energy greater than that of a laser for generating EUV high-order harmonics is necessary.

SUMMARY OF THE INVENTION

The present invention is directed to an apparatus and method for calibrating an extreme ultraviolet (EUV) spectrometer to accurately measure a wavelength of a spectrum of EUV light used for EUV lithography and mask inspection technology.

According to a first aspect of the present invention, there is provided an apparatus for calibrating an EUV spectrometer, including: a means for generating EUV light by an interaction of laser light and an inert gas in a vacuum chamber and a zirconium (Zr) filter configured to transmit a wavelength of a specific band and block a wavelength band of a femtosecond laser among wavelengths of the generated EUV light; and an EUV spectrometer calibration unit including an optical module having at least one mirror to reflect only a wavelength of a specific band among wavelengths of EUV light transmitted from the Zr filter of the EUV generation module, a diffraction grating configured to separate a wavelength of a specific band of the EUV light reflected from the mirror of the optical module based on wavelengths, a charge-coupled device (CCD) camera configured to capture the EUV light of the wavelength of the specific band separated from the diffraction grating, and a spectrum conversion module configured to convert a pixel of an image captured from the CCD camera into a wavelength so as to obtain a spectrum according to a harmonic generation order of the EUV light.

Here, the apparatus preferably further includes a control module configured to capture the EUV light output from the diffraction grating through the CCD camera after transmitting the EUV light transmitted from the Zr filter to the diffraction grating in a state in which the optical module is removed, convert a position of the pixel to a wavelength after converting the pixel of the captured image into a wavelength, receiving spectrum information according to a harmonic generation order of the EUV light and matching the received spectrum information with spectrum information obtained through the spectrum conversion module, and check a peak position of the specific band wavelength through comparison and analysis.

Preferably, the optical module may reflect only a wavelength of a specific band among wavelengths of the EUV light transmitted from the Zr filter so that heights (Z axis) of spectra matched through the control module are different from each other.

Preferably, the number of peaks of the wavelength of the specific band may be at least one.

Preferably, the Zr filter of the EUV generation module may block a range of wavelengths centered on 800 nm, which is a peak wavelength of femtosecond laser light.

Preferably, the wavelength of the specific band may range from 7 nm to 17 nm.

According to a second aspect of the present invention, there is provided a method of calibrating an EUV spectrometer, including: (a) generating EUV light by an interaction of laser light and an inert gas in a vacuum chamber; (b) transmitting a wavelength of a specific band among wavelengths of the EUV light generated through a Zr filter in operation (a) and blocking a wavelength band of a femtosecond laser; (c) reflecting only a wavelength of a specific band among wavelengths of the EUV light transmitted through an optical module having at least one mirror in operation (b); (d) separating a wavelength of a specific band of the EUV light reflected through a diffraction grating in operation (c) based on wavelengths; (e) capturing the separated EUV light having the wavelength of the specific band through a CCD camera in operation (d); and (f) converting a pixel of an image captured through a spectrum conversion module in operation (e) into a wavelength and obtaining a spectrum according to a harmonic generation order of the EUV light.

Here, in operation (b), the Zr filter preferably blocks a range of wavelengths centered on 800 nm, which is a peak wavelength of femtosecond laser light.

Preferably, in operation (b), the wavelength of the specific band may range from 7 nm to 17 nm.

Preferably, after operation (b), the method may further include separating a wavelength of a specific band among wavelengths of the EUV light transmitted through the diffraction grating in operation (a) based on wavelengths, capturing a spectrum of the EUV light through the CCD camera, converting a pixel of the captured image into a wavelength and obtaining a spectrum according to a harmonic generation order of EUV light.

According to a third aspect of the present invention, there is provided a method of calibrating an EUV spectrometer, including: (a') transmitting a wavelength of a specific band among wavelengths of EUV light generated from outside through a first Zr filter and blocking a wavelength band of a femtosecond laser based on wavelengths, separating a wavelength of a specific band transmitted through a diffraction grating based on wavelengths, capturing the separated EUV light through a CCD camera, converting a pixel of a captured image into a wavelength and obtaining a spectrum according to a harmonic generation order of the EUV light; (b') transmitting the wavelength of the specific band among wavelengths of EUV light generated from outside through a second Zr filter and blocking a wavelength band of the femtosecond laser, reflecting only a wavelength of a specific band among wavelengths of the EUV light transmitted through an optical module having at least one mirror, separating a wavelength of a specific band reflected through the diffraction grating based on wavelengths, capturing a wavelength of a specific band of the separated EUV light through the CCD camera, converting a pixel of the captured image into a wavelength and obtaining a spectrum according to a harmonic generation order of the EUV light through a spectrum conversion module; and (c') matching the spectrum obtained in operation (a') with the spectrum obtained in operation (b') through a control module, converting a position of the pixel into a wavelength, and checking a peak position of the wavelength of the specific band through comparison and analysis.

Here, in operation (b'), the optical module preferably reflects only a wavelength of a specific band among wavelengths of the EUV light transmitted through the second Zr filter so that heights (Z axis) of spectra obtained in operation (a') and operation (b') are different from each other.

Preferably, in operation (c'), the number of peaks of the wavelength of the specific band may be at least one.

Preferably, the first and second Zr filters may block a range of wavelengths centered on 800 nm, which is a peak wavelength of femtosecond laser light.

Preferably, the wavelength of the specific band may range from 7 nm to 17 nm.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Hereinafter, various embodiments will now be described more fully with reference to the accompanying drawings in which some embodiments are shown. However, since the invention is not limited to the embodiments disclosed hereinafter, the embodiments of the invention should be implemented in various forms. The embodiments of the invention are only provided for complete disclosure of the invention and to fully show the scope of the invention to those skilled in the art, and only defined by the scope of the appended claims. The same reference numbers will be used throughout this specification to refer to the same or like components. As used herein, the term "and/or" includes each and all combinations of at least one of the referred items.

It will be understood that, although the terms first, second, etc. may be used herein to describe various elements, components and/or sections, these elements, components and/or sections should not be limited by these terms. These terms are only used to distinguish one element, component or section from another. Therefore, a first element, a first component or a first section could be termed a second element, a second component or a second section within the scope of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In descriptions of the invention, when it is determined that detailed explanations of related well-known functions or configurations unnecessarily obscure the gist of the invention, the detailed description thereof will not be repeated. Some terms described below are defined in consideration of functions in the invention and meanings may vary depending on, for example, a user or operator's intentions or customs. Therefore, the meanings of terms should be interpreted based on the scope throughout this specification.

Figure 1:
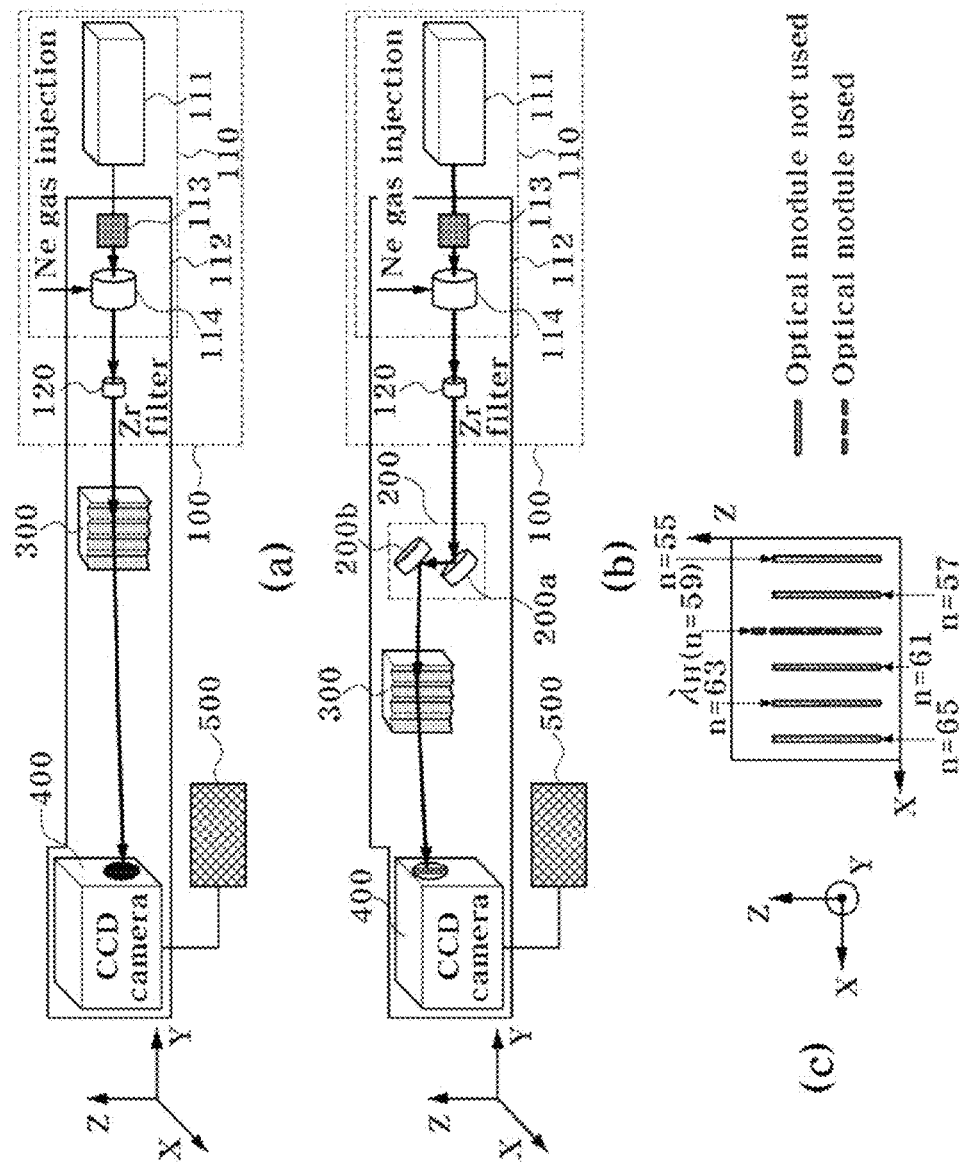
FIG. 1 is an overall conceptual view for describing an apparatus for calibrating an extreme ultraviolet (EUV) spectrometer according to embodiments of the present invention.
Figure 2:
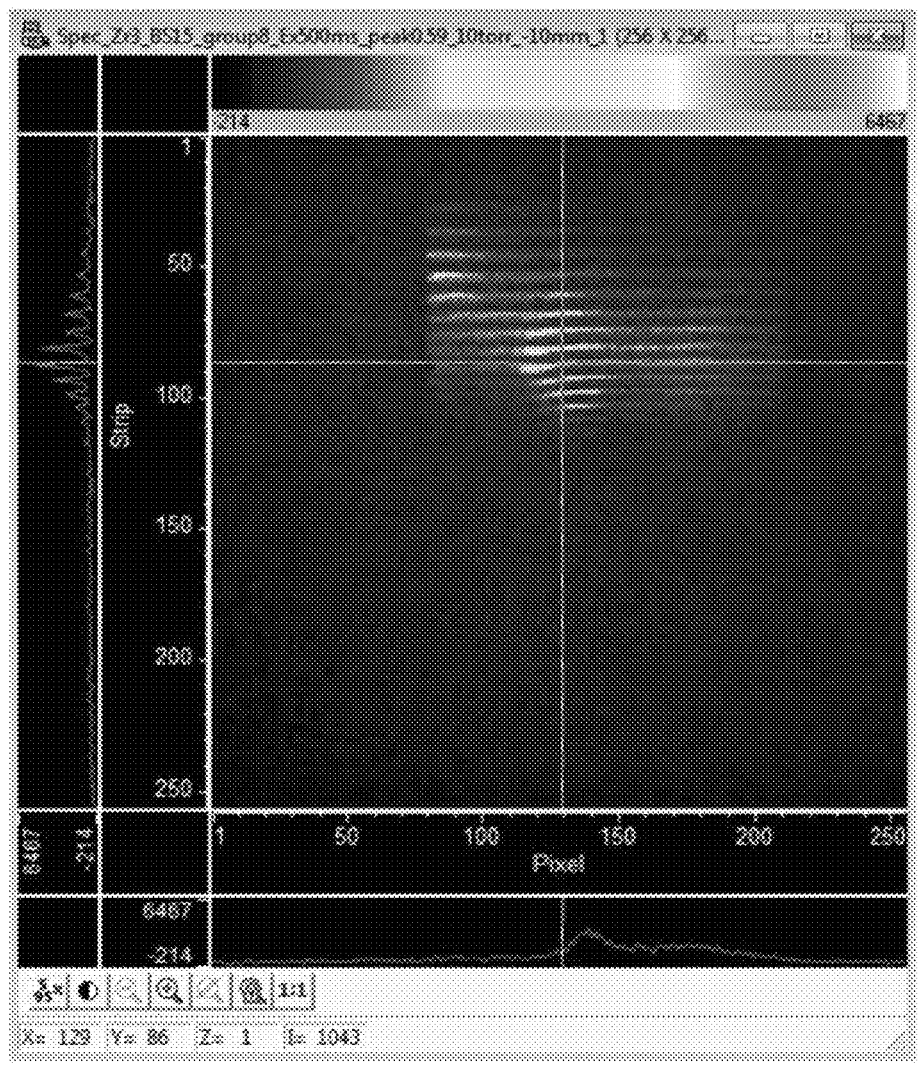
FIG. 2 is a diagram showing a spectrum image of EUV light captured through a charge-coupled device (CCD) camera using the apparatus for calibrating an EUV spectrometer according to the embodiments of the present invention.
Figure 3:
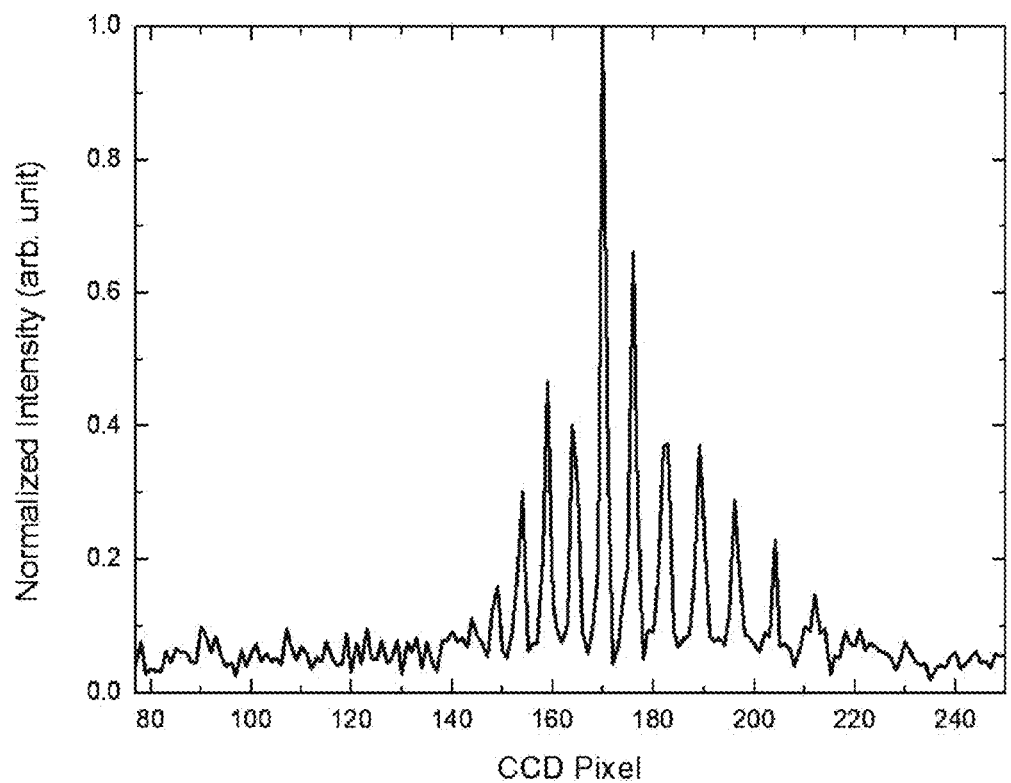
FIG. 3 is a spectrum of EUV light obtained through a spectrum conversion module according to the embodiments of the present invention.
Figure 4:
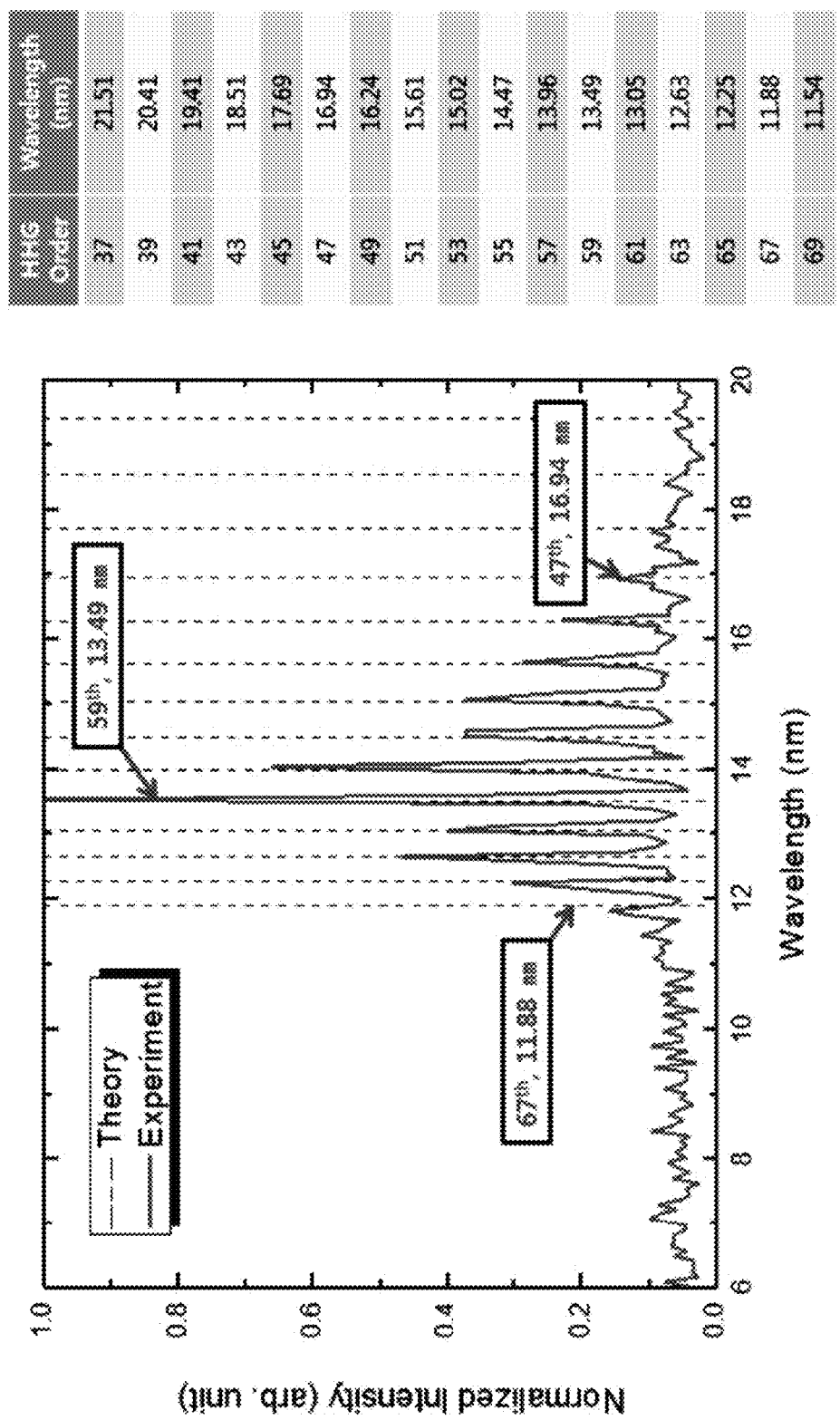
FIG. 4 is a spectrum of EUV light in which a pixel is converted into a wavelength through a spectrum control module according to the embodiments of the present invention.

FIG. 1 is an overall conceptual view for describing an apparatus for calibrating an extreme ultraviolet (EUV) spectrometer according to embodiments of the present invention, FIG. 2 is a diagram showing a spectrum image of EUV light captured through a charge-coupled device (CCD) camera using the apparatus for calibrating an EUV spectrometer according to the embodiments of the present invention, FIG. 3 is a spectrum of EUV light obtained through a spectrum conversion module according to the embodiments of the present invention, and FIG. 4 is a spectrum of EUV light in which a pixel is converted into a wavelength through a spectrum control module according to the embodiments of the present invention.

FIG. 1A is a diagram showing a general apparatus for calibrating an EUV spectrometer, and FIG. 1B is a diagram showing an apparatus for calibrating an EUV spectrometer according to an embodiment of the present invention.

Referring to FIGS. 1 to 4, the apparatus for calibrating an EUV spectrometer according to embodiments of the present invention includes an EUV generation module 100, an optical module 200, a diffraction grating 300, a CCD camera 400 and a spectrum conversion module 500.

Here, the EUV generation module 100 includes an EUV generation module 110 configured to generate EUV light by an interaction of laser light and an inert gas in a vacuum chamber and a zirconium (Zr) filter 120 configured to block out a range of wavelengths centered on 800 nm (preferably about 796 nm), which is a peak wavelength of femtosecond laser light, and transmit wavelengths of a specific band (preferably a range of about 7 nm to 17 nm) among wavelengths of the EUV light generated from the EUV generation module 110. That is, the Zr filter 120 preferably blocks wavelengths of about 20 nm or more and transmits wavelengths in a range of about 7 nm to 17 nm.

In this case, the EUV generation module 110 includes a laser light generation part 111, a vacuum chamber 112, a plurality of optical elements 113 and an EUV generation part 114.

As the laser light generation part 111 is a laser oscillator for outputting light with an intensity of about $10^{11}$ W/cm$^2$, a femtosecond laser is output as a light source for high-order harmonic generation according to the embodiments of the present invention.

As preferable embodiments according to the present invention, the laser light generation part 111 has a 35 femtosecond pulse width and a femtosecond laser is output through a laser oscillator of which titanium sapphire is used as a laser gain medium. The conditions of the femtosecond laser such as a pulse width, a wavelength, etc. may be changed in various embodiments, and a fiber-based femtosecond laser may be used depending on usage and an environment.

Further, the femtosecond laser generated in the laser light generation part 111 has a laser repetition rate of 1 kHz and maximum energy per pulse is several mJ.

As the vacuum chamber 112 is a chamber that maintains its internal environment in a vacuum state, pressure in the chamber in which the EUV light is transmitted is preferably about $10^{-5}$ Torr or less, and partial pressures of oxygen and water are preferably as low as possible.

Meanwhile, almost any environment other than the laser light generation part 111 is preferably disposed within the vacuum chamber 112. That is, because all the EUV light is absorbed in the air, the EUV light source should be made in the vacuum chamber 112, and analysis of characteristics of the generated EUV light should also be performed in the vacuum chamber 112 when the EUV light is generated.

The plurality of optical elements 113 are disposed inside the vacuum chamber 112 to properly transmit high-power laser light generated from the laser light generation part 111. For example, a path of laser light generated from the laser light generation part 111 through first and second optical elements (not shown) constituted of reflecting mirrors is changed and a position of the laser light is regulated, and for example, the light moves toward a third optical element (not shown) constituted of a concave mirror. The laser light changed from the first and second optical elements through the third optical element is condensed, for example, by reflecting to a fourth optical element (not shown) constituted of a reflecting mirror. Then, the laser light condensed from the third optical element through the fourth optical element is reflected and transmitted to the EUV generation part 114. The number and placement of the plurality of optical elements are variously changeable by those skilled in the art depending on the design.

Particularly, the EUV generation part 114 for generating EUV light according to the embodiments of the present invention performs a function of injecting an inert gas to generate an EUV light with a wavelength band of several tens of nanometers to several nanometers, and maintaining constant pressure by collecting the inert gas.

The EUV generation part 114 is disposed inside the vacuum chamber 112 for generating EUV light and as a housing forming a whole body, and performs a function of generating EUV light by an interaction of laser light and an inert gas (for example, helium (He), Ne, Ar, etc.) in the vacuum chamber 112.

In a high-order harmonic generation method through the EUV generation part 114 according to the embodiments of the present invention configured above, for example, electrons are ionized, move along a track and are recombined due to a high time-varying electric field applied to an inert gas such as Ar, Ne or Xe, or a mixed gas thereof, and energy corresponding to the sum of the ionization energy and kinetic energy of the electrons generates EUV light.

That is, when the femtosecond laser is incident on atoms of the inert gas concentrated in the housing of the EUV generation part 114, electrons within the atoms of the inert gas contained in the housing by a strong electric field of the laser break free from the atoms and are ionized by a tunneling effect.

The ionized electrons are no longer affected by the atoms, are accelerated by the strong electric field exerted by the laser, and gain kinetic energy while being accelerated. Then, the electric field of the laser is changed, and the electrons are recombined with the atoms. Here, energy corresponding to the sum of the kinetic energy obtained by the laser and the ionization energy generated by recombining the atoms and the electrons is emitted as light, and becomes an EUV light source.

Further, because the generated EUV light is absorbed by impurities in the air and disappears, it should be made in vacuum environment, that is, in the vacuum chamber 112. Components other than those of the laser light generation part 111 and the spectrum conversion module 500 are preferably included in the vacuum chamber 112.

Meanwhile, the EUV generation part 114 according to the embodiments of the present invention configured above is specifically described in a prior patent application filed by the same applicant No. 2012-0095715 (module for generating EUV light) and the detailed description thereof is referred to as prior art. Further, any form of the EUV generation part 114 as long as only the EUV light of a desired wavelength is generated, in addition to the disclosure of the prior art.

The optical module 200 includes at least one mirror 200a and 200b (in FIG. 1B) reflecting only wavelengths of a specific band (preferably a range of about 7 nm to 17 nm, and more preferably about 13.5 nm) among wavelengths of EUV light transmitted from the Zr filter 120 of the EUV generation module 100. That is, as shown in FIG. 1B, two of the mirrors 200a and 200b of the optical module 200 may be disposed.

The mirrors 200a and 200b of the optical module 200 are a kind of reflective filter through which a wavelength band of the femtosecond laser generated from the laser light generation part 111 is blocked, and a specific wavelength (preferably 13.5 nm) among wavelengths of the EUV light is reflected.

Meanwhile, as shown in FIG. 1A, although a spectrum of EUV light is typically measured without the optical module 200, in this case, because a wavelength position is still not accurate enough to convert the X-axis into a wavelength, there have been problems with locating a pixel position.

The diffraction grating 300 in FIG. 1A performs a function of separating wavelengths of a specific band (preferably a range of about 7 nm to 17 nm) among wavelengths of the EUV light transmitted from the Zr filter 120 of the EUV generation module 100 based on wavelengths.

Further, the diffraction grating 300 in FIG. 1B performs a function of refracting a specific wavelength (about 13.5 nm) reflected from the mirrors 200a and 200b of the optical module 200 at a unique angle.

The CCD camera 400 performs a function of capturing an EUV beam with a wavelength of a specific band separated from the diffraction grating 300.

The spectrum conversion module 500 performs a function of setting a portion of the EUV light of which an intensity is the highest among images (refer to FIG. 2) captured from the CCD camera 400 as a central axis, converting a pixel into a wavelength in the central axis, and obtaining a spectrum (refer to FIG. 3) according to a harmonic generation order of EUV light.

Meanwhile, as shown in FIG. 1A, the EUV light generated from the EUV generation module 110 penetrates the Zr filter 120 and the EUV light separated from the diffraction grating 300 is captured through the CCD camera 400. Then, a pixel of an image captured as shown in FIG. 2 is set as an arbitrary position as shown in FIG. 3 and a spectrum is obtained.

Further, as shown in FIG. 1B, the EUV light generated from the EUV generation module 110 penetrates the Zr filter 120, is reflected in the mirrors 200a and 200b of the optical module 200, and is incident on the diffraction grating 300 by changing only a position of Z-axis. The EUV light have a wavelength of a specific band separated from the diffraction grating 300 is captured through the CCD camera 400, a pixel of an image captured as shown in FIG. 2 is set as an arbitrary position and a spectrum is obtained as shown in FIG. 3. A control module (not shown) configured to convert a position of a pixel into a wavelength as shown in FIG. 4 by comparing and analyzing, and check a peak position of a wavelength of a specific band (for example, 13.5 nm) is preferably further included after matching the two pieces of spectrum information through the spectrum conversion module 500.

A position of a wavelength of a specific desired band (for example, 13.5 nm) among peaks of the EUV spectrum may be easily found through the control module.

That is, comparing a spectrum image obtained using the optical module 200 as shown in FIG. 1B with a spectrum image obtained not using the optical module 200 as shown in FIG. 1A, it may be seen that only a height (Z-axis) of the spectrum of the EUV light is changed, and a wavelength of a specific band (for example, about 13.5 nm) of the EUV light is measured to have only one peak or several peaks as shown in FIG. 1C.

Here, although it is best if only one peak is measured, even when peaks with an adjacent order except a peak of a wavelength of a specific band (for example, 13.5 nm) are measured, it is possible to compare and analyze a unique wavelength characteristic of high-order harmonic generation through the following Equation 1.

$$\lambda/n = \lambda_H(n) \qquad \text{Equation 1}$$

Here, $\lambda$ is a wavelength of a seed laser, that is, a laser output from the laser light generation part 111, n is a harmonic generation order, and $\lambda_H(n)$ is a wavelength of an $n^{th}$ harmonic.

That is, in order to calibrate a spectrum using an atom line, as a position value of wavelength on the atom line should be found at at least two points, a wavelength value of the EUV spectrum may be obtained by comparing a wavelength value on the atom line and a spatial position in a CCD image. However, if the above equation is used in high-order harmonic generation, even when only one point of a wavelength value is found as a spatial position in a CCD image, values of all high-order harmonics in the EUV spectrum may be obtained.

In other words, a wavelength of a specific band (for example, about 13.5 nm) and wavelengths of peaks adjacent thereto may be obtained as follows: About 796 nm divided by the $59^{th}$ order is about 13.49 nm, and since an adjacent wavelength is a + value or a − value of the order, it is possible to know a next or previous wavelength.

Meanwhile, the mirrors 200a and 200b of the optical module 200 shown in FIG. 1B may be placed on or removed from a path of the EUV light in order not to change paths (Z-axis and Y-axis) of the EUV light.

An X-Y plane position of light transmitted as it is by changing the lower mirror 200a among the mirrors 200a and 200b of the optical module 200 into a beam splitter and light which hits and is transmitted by the upper mirror 200b (for example, an 800 nm reflecting mirror) are checked, and it is checked whether progress paths of light are the same. If they are not the same, angles of the mirrors are regulated to be the same.

According to the above-described apparatus and method for calibrating an EUV spectrometer, there is an advantage in that a wavelength of a spectrum of EUV light used for EUV lithography and mask inspection technology may be accurately measured.

While preferable embodiments with respect to an apparatus and method for calibrating an EUV spectrometer according to the present invention has been described, the invention is not limited thereto and may be embodied with various modifications within the scope of the appended claims, detailed description and the accompanying drawings, and such embodiments are also within the scope of the invention.

What is claimed is:

1. An apparatus for calibrating an extreme ultraviolet (EUV) spectrometer, comprising:
    an EUV generation module including a means for generating EUV light by an interaction of laser light and an inert gas in a vacuum chamber and a zirconium (Zr) filter configured to transmit a wavelength of a specific band and block a wavelength band of a femtosecond laser among wavelengths of the generated EUV light; and
    an EUV spectrometer calibration unit including an optical module having at least one mirror to reflect only a wavelength of a specific band among wavelengths of EUV light transmitted from the Zr filter of the EUV generation module, a diffraction grating configured to separate a wavelength of a specific band of the EUV light reflected from the mirror of the optical module based on wavelengths, a charge-coupled device (CCD) camera configured to capture the EUV light having the wavelength of the specific band separated from the diffraction grating, and a spectrum conversion module configured to convert a pixel of an image captured from the CCD camera into a wavelength so as to obtain a spectrum according to a harmonic generation order of the EUV light; and
    a control module configured to capture the EUV light output from the diffraction grating through the CCD camera after transmitting the EUV light transmitted from the Zr filter to the diffraction grating in a state in which the optical module is removed, convert a position of the pixel to a wavelength after converting the pixel of the captured image to a wavelength, receiving spectrum information according to a harmonic generation order of the EUV light and matching the received spectrum information with spectrum information obtained through the spectrum conversion module, and check a peak position of the specific band wavelength through comparison and analysis.

2. The apparatus of claim 1, wherein the optical module reflects only a wavelength of a specific band among wavelengths of the EUV light transmitted from the Zr filter so that heights (Z axis) of spectra matched through the control module are different from each other.

3. An apparatus for calibrating an extreme ultraviolet (EUV) spectrometer, comprising:
    an EUV generation module including a means for generating EUV light by an interaction of laser light and an inert gas in a vacuum chamber and a zirconium (Zr) filter configured to transmit a wavelength of a specific band and block a wavelength band of a femtosecond laser among wavelengths of the generated EUV light; and
    an EUV spectrometer calibration unit including an optical module having at least one mirror to reflect only a wavelength of a specific band among wavelengths of EUV light transmitted from the Zr filter of the EUV generation module, a diffraction grating configured to separate a wavelength of a specific band of the EUV light reflected from the mirror of the optical module based on wavelengths, a charge-coupled device (CCD) camera configured to capture the EUV light having the wavelength of the specific band separated from the diffraction grating, and a spectrum conversion module configured to convert a pixel of an image captured from the CCD camera into a wavelength so as to obtain a spectrum according to a harmonic generation order of the EUV light wherein the Zr filter of the EUV generation module blocks a range of wavelengths centered on 800 nm, which is a peak wavelength of femtosecond laser light.

4. A method of calibrating an extreme ultraviolet (EUV) spectrometer, the method comprising:
    (a) generating EUV light by an interaction of laser light and an inert gas in a vacuum chamber;
    (b) transmitting a wavelength of a specific band among wavelengths of the EUV light generated through a zirconium (Zr) filter in operation (a), and blocking a wavelength band of a femtosecond laser;
    (c) reflecting only a wavelength of a specific band among wavelengths of the EUV light transmitted through an optical module having at least one mirror in operation (b);
    (d) separating a wavelength of a specific band of the EUV light reflected through a diffraction grating in operation (c) based on wavelengths;
    (e) capturing the separated EUV light having the wavelength of the specific band through a charge-coupled device (CCD) camera in operation (d); and
    (f) converting a pixel of an image captured through a spectrum conversion module in operation (e) into a wavelength, and obtaining a spectrum according to a harmonic generation order of the EUV light, wherein, in operation (b), the Zr filter blocks a range of wavelengths centered on 800 nm, which is a peak wavelength of femtosecond laser light.

5. A method of calibrating an extreme ultraviolet (EUV) spectrometer, the method comprising:
    (a') transmitting a wavelength of a specific band among wavelengths of EUV light generated from outside through a first zirconium (Zr) filter and blocking a wavelength band of a femtosecond laser based on wavelengths, separating a wavelength of a specific band transmitted through a diffraction grating based on wavelengths, capturing the separated EUV light through a charge-coupled device (CCD) camera, converting a pixel of the captured image into a wavelength and obtaining a spectrum according to a harmonic generation order of the EUV light;

(b') transmitting a wavelength of a specific band among wavelengths of EUV light generated from outside through a second Zr filter and blocking a wavelength band of the femtosecond laser, reflecting only a wavelength of a specific band among wavelengths of the EUV light transmitted through an optical module having at least one mirror, separating the wavelength of the specific band reflected through the diffraction grating based on wavelengths, capturing a wavelength of a specific band of the separated EUV light through the CCD camera, converting a pixel of the captured image into a wavelength and obtaining a spectrum according to a harmonic generation order of the EUV light through a spectrum conversion module; and (c') matching the spectrum obtained in operation (a') with the spectrum obtained in operation (b') through a control module, converting a position of the pixel into a wavelength, and checking a peak position of the wavelength of the specific band through comparison and analysis.

6. The method of claim 5, wherein, in operation (b), the optical module reflects only a wavelength of a specific band among wavelengths of the EUV light transmitted through the second Zr filter so that heights (Z axis) of spectra obtained in operation (a') and operation (b') are different from each other.

7. The method of claim 5, wherein, in operation (c'), the number of peaks of the wavelength of the specific band is at least one.

8. The method of claim 5, wherein the first and second Zr filters block a range of wavelengths centered on 800 nm, which is a peak wavelength of femtosecond laser light.

9. The method of claim 5, wherein the wavelength of the specific band ranges from 7 nm to 17 nm.

* * * * *